(12) United States Patent
Chun et al.

(10) Patent No.: US 8,772,112 B1
(45) Date of Patent: Jul. 8, 2014

(54) METHOD FOR FABRICATING SEMICONDUCTOR DEVICE

(71) Applicant: Hyundai Motor Company, Seoul (KR)

(72) Inventors: Dae Hwan Chun, Gyeonggi-Do (KR);
Jong Seok Lee, Gyeonggi-Do (KR);
Kyoung-Kook Hong, Gyeonggi-Do (KR); Youngkyun Jung, Seoul (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 13/830,260

(22) Filed: Mar. 14, 2013

(30) Foreign Application Priority Data

Dec. 31, 2012 (KR) .......................... 10-2012-0158603

(51) Int. Cl.
*H01L 21/336* (2006.01)
*H01L 29/66* (2006.01)

(52) U.S. Cl.
CPC ................................ *H01L 29/66666* (2013.01)
USPC ............................................................ 438/270

(58) Field of Classification Search
USPC ............................................................ 438/270
See application file for complete search history.

*Primary Examiner* — Marvin Payen
(74) *Attorney, Agent, or Firm* — Edwards Wildman Palmer LLP; Peter F. Corless

(57) ABSTRACT

Disclosed is a method for fabricating a semiconductor device including: sequentially forming a first insulating film and a first barrier layer on a first surface of a substrate; etching the first barrier layer to form a first barrier layer pattern; etching the first insulating film to form a first insulating film pattern; removing the first barrier layer pattern and forming a first type epitaxial layer on an exposed first portion of the substrate; forming a second insulating film and a second barrier layer on the first type epitaxial layer and the first insulating film pattern; etching the second barrier layer to form a second barrier layer pattern; etching the second insulating film to form a second insulating film pattern, and etching the first insulating film pattern; and forming a second type epitaxial layer on an exposed second portion of the first surface of the n substrate.

10 Claims, 7 Drawing Sheets

METHOD FOR FABRICATING SEMICONDUCTOR DEVICE

CROSS-REFERENCE TO RELATED APPLICATION

This application claims priority to and the benefit of Korean Patent Application No. 10-2012-0158603 filed in the Korean Intellectual Property Office on Dec. 31, 2012, the entire contents of which are incorporated herein by reference.

BACKGROUND OF THE INVENTION (a) Field of the Invention

The present invention relates to a method for fabricating a semiconductor device.

(b) Description of the Related Art

With the recent trend toward large-sized and large-capacity application apparatuses, a power semiconductor device having a high breakdown voltage, a high current capacity, and high-speed switching characteristics has become necessary.

The doping concentration and thickness of an epitaxial or drift region of a raw material used in the fabrication of a power semiconductor device is determined based on the rated voltage of the semiconductor device.

To achieve a high breakdown voltage, the doping concentration of the epitaxial or drift region needs to be sufficiently low, or the thickness thereof needs to be sufficiently large. This may result in an increase in the on-resistance of the power semiconductor. Thus, a variety of structures are being proposed to overcome this drawback by structural improvement of the device. For example, a super junction structure is a representative structure which shows improvement in breakdown voltage and on-resistance.

A super junction structure is a structure in which PN junctions are vertically arranged in an epitaxial or drift region. In a power semiconductor having a super junction structure, where a maximum electric field (i.e., threshold electric field) is observed when the power semiconductor is in the off state, a PN junction is formed vertically with respect to a substrate. This causes a depletion layer to extend horizontally, as well as vertically, to the substrate. As such, the threshold electric field is reached in a wide PN junction and its magnitude is constant in a direction vertical to the substrate.

As such, a power semiconductor using a super junction structure has low on-resistance because an epitaxial or drift region for maintaining a breakdown voltage equivalent to that of a typical power semiconductor is thin and has a high doping concentration.

In general, a super junction structure is formed by epitaxially growing an N type (or P type) semiconductor or performing trench etching, i.e., anisotropic etching, on the N type (or P type) semiconductor and either (a) depositing a P type (or N type) semiconductor or (b) ion-implanting impurities to form a P type (or N type) semiconductor.

Also, an epitaxial or drift region of desired thickness is formed by repeating the process of epitaxially growing a thin N type (or P type) semiconductor and ion-implanting impurities to form a P type (or N type) semiconductor.

In this method, however, it is difficult to perform high aspect-ratio anisotropic etching. As a result, it is difficult to form an epitaxial or drift region of a desired thickness, and PN junctions may be curved rather than smooth.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a method for easily forming a super junction structure of a semiconductor device.

According to one aspect, the present invention provides a method for fabricating a semiconductor device, the method including: sequentially forming a first insulating film and a first barrier layer on a first surface of an n+ type silicon carbide substrate; etching the first barrier layer to form a first barrier layer pattern; etching the first insulating film by using the first barrier layer pattern as a mask to form a first insulating film pattern that exposes a first portion of a first surface of the n+ type silicon carbide substrate; removing the first barrier layer pattern and then forming a first type of epitaxial layer by a first epitaxial growth on the exposed first portion of the first surface of the n+ type silicon carbide substrate; sequentially forming a second insulating film and a second barrier layer on the first type of epitaxial layer and the first insulating film pattern; etching the second barrier layer to form a second barrier layer pattern; etching the second insulating film by using the second barrier layer pattern as a mask to form a second insulating film pattern, and etching the first insulating film pattern by using the second barrier layer pattern as a mask to expose a second portion of the first surface of the n+ type silicon carbide substrate; and forming a second type of epitaxial layer by a second epitaxial growth on the exposed second portion of the first surface of the n+ type silicon carbide substrate, wherein the first portion of the first surface of the n+ type silicon carbide substrate and the second portion of the first surface of the n+ type silicon carbide substrate are adjacent to each other.

According to various embodiments, the first insulating film pattern, the first type of epitaxial layer, and the second type of epitaxial layer have the same thickness.

According to various embodiments, the second insulating film pattern is positioned on the first type of epitaxial layer.

According to various embodiments, the first insulating film and the second insulating film are formed of any one or more of silicon dioxide, silicon oxynitride, silicon nitride, and amorphous carbon.

According to various embodiments, the first barrier layer and the second barrier layer are formed of any one or more of amorphous carbon, silicon dioxide, silicon nitride, nitride, and metal.

According to various embodiments, the method further includes: after forming the second type of epitaxial layer, removing the second insulating film pattern and then sequentially forming a p+ region and an n+ region on the first type of epitaxial layer and the second-type of epitaxial layer; forming a trench by penetrating the p+ region and the n+ region and etching part of the first type of epitaxial layer; forming a gate insulating film within the trench; forming a gate electrode on the gate insulating film; forming an oxide film on the gate insulating film and the gate electrode; and forming a source electrode on the n+ region and the oxide film and forming a drain electrode on a second surface of the n+ type silicon carbide substrate.

According to various embodiments, the first type of epitaxial layer is positioned under the gate electrode.

According to various embodiments the first type of epitaxial layer is an n type epitaxial layer, and the second type epitaxial layer is a p type epitaxial layer.

According to various embodiments the first type of epitaxial layer is a p type epitaxial layer, and the second type of epitaxial layer is an n type epitaxial layer.

According to an exemplary embodiment of the present invention, because an insulating film is etched by using a barrier layer in the fabrication of a super junction structure of a semiconductor device, high aspect-ratio anisotropic etching can be performed. As such, the n type epitaxial layer and the p type epitaxial layer can be made thicker than in the conventional art. This offers an advantage in the fabrication of a high-voltage power semiconductor.

Moreover, according to the present methods, a PN junction surface is not curved because an n type epitaxial layer and a p type epitaxial layer are formed by epitaxial growth.

Other aspects and exemplary embodiments of the invention are discussed infra.

DETAILED DESCRIPTION OF THE EMBODIMENTS

Figure 1:
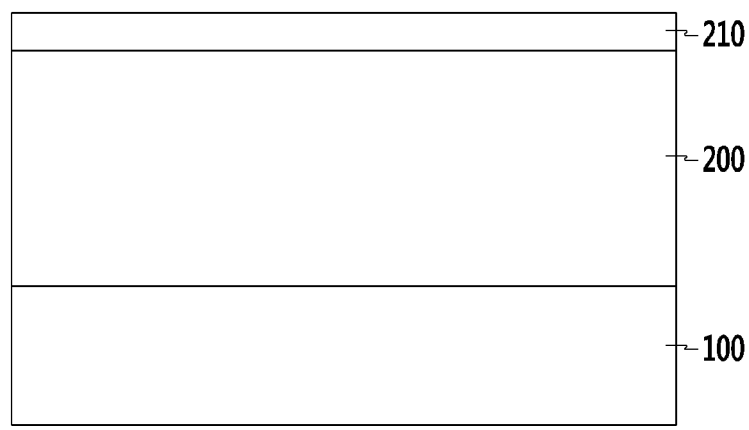
FIG. 1 to FIG. 12 are views sequentially showing a method for fabricating a semiconductor device according to an exemplary embodiment of the present invention.

Exemplary embodiments of the present invention will be described in detail with reference to the attached drawings. The present invention may be modified in many different forms and should not be construed as being limited to the exemplary embodiments set forth herein. Rather, the exemplary embodiments of the present invention are provided so that this disclosure will be thorough and complete, and will fully convey the concept of the present invention to those skilled in the art.

In the drawings, the thickness of layers and regions may be exaggerated for clarity. In addition, when a layer is described to be formed on another layer or on a substrate, this means that the layer may be formed on the other layer or on the substrate, or a third layer may be interposed between the layer and the other layer or the substrate. Like numbers refer to like elements throughout the specification.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about".

Hereinafter, a method for fabricating a semiconductor device according to an exemplary embodiment of the present invention will be described in detail with reference to FIGS. 1 to 12.

FIG. 1 to FIG. 12 are views sequentially showing a method for fabricating a semiconductor device according to an exemplary embodiment of the present invention.

As shown in FIG. 1, an n+ type silicon carbide substrate 100 is prepared, a first insulating film 200 is formed on a first surface ("top surface") of the n+ type silicon carbide substrate 100, and then a first barrier layer 210 is formed on the first insulating film 200 such that the first insulating film 200 is disposed between the substrate 100 and the a first barrier layer 210.

The first insulating film 200 may be formed of any conventional insulating materials, and preferably is formed of silicon dioxide ($SiO_2$), silicon oxynitride (SiON), silicon nitride (SiN), amorphous carbon, or combinations thereof. The first barrier layer 210 may be formed of any conventional barrier layer materials, and preferably is formed of amorphous carbon, silicon dioxide, silicon nitride, nitride, various metals, or combinations thereof.

The first barrier layer 210 has a high etching selection ratio in the etching of the first insulating film 200. As depicted, for example, in FIG. 2, the first surface of the n+ type silicon carbide substrate 100 includes a first portion A and a second portion B adjacent to the first portion A.

Figure 2:
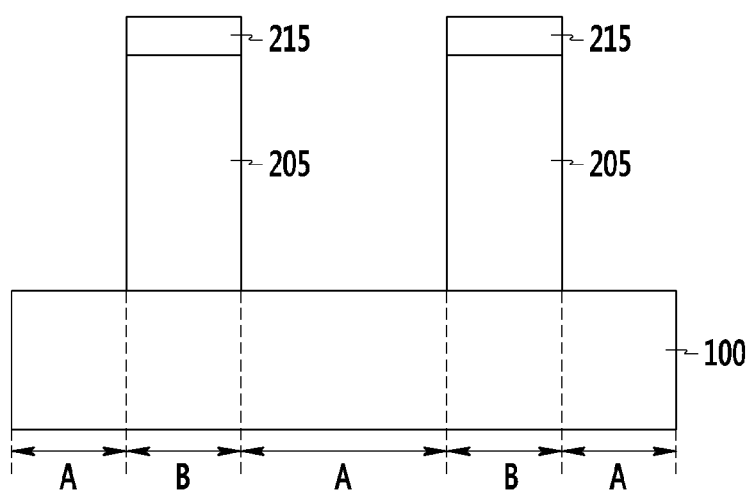

As shown in FIG. 2, the first barrier layer 210 is etched to form a first barrier layer pattern 215, and then the first insulating film 200 is etched by using the first barrier layer pattern 215 as a mask to form a first insulating film pattern 205. Because high aspect-ratio anisotropic etching can be performed on the first insulating film 200 by using the first barrier layer 210, there is no limitation to the thickness of the first insulating film 200. At this point, the first portion A of the first surface of the n+ type silicon carbide substrate 100 is exposed.

Figure 3:
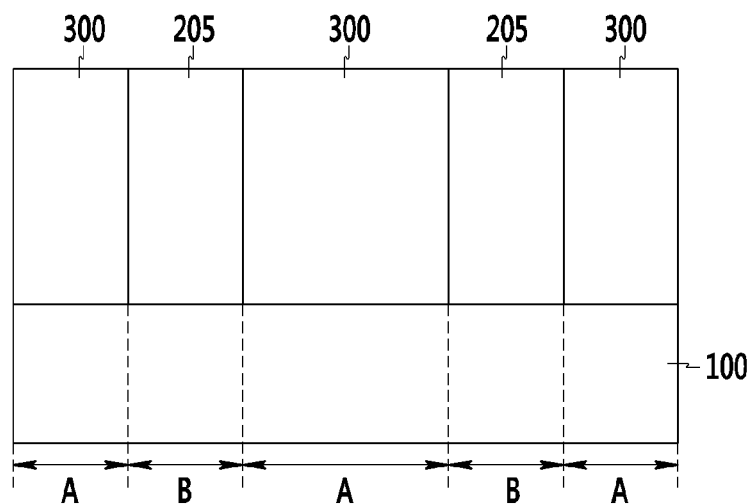

As shown in FIG. 3, the first barrier layer pattern 215 is removed, and then an n type epitaxial layer 300 is formed by a first epitaxial growth on the exposed first portions A of the first surface of the n+ type silicon carbide substrate 100. Epitaxial growth does not occur in the portions where the first insulating film pattern 205 is provided. As shown, the n type epitaxial layer 300 is positioned in between and about the first insulating film pattern 205, and the height of the n type epitaxial layer 300 is equal to the height of the first insulating film pattern 205.

Figure 4:
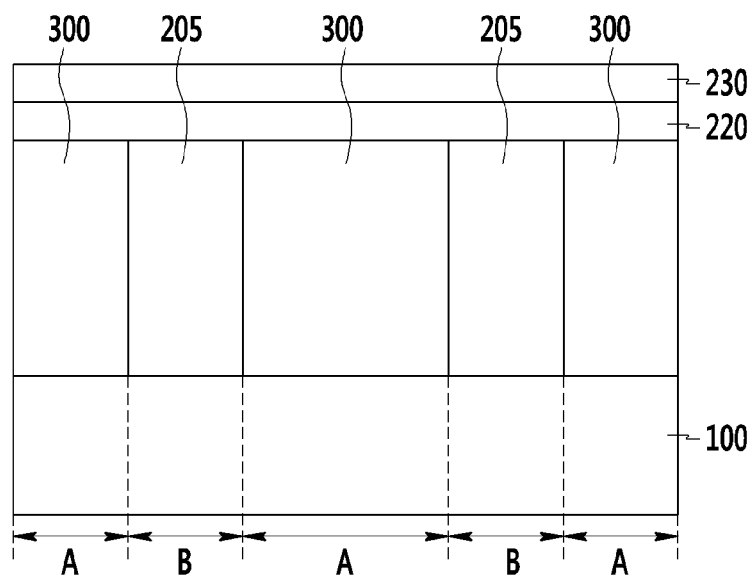

As shown in FIG. 4, a second insulating film 220 and a second barrier layer 230 are sequentially formed on the n type epitaxial layer 300 and the first insulating film pattern 205.

According to embodiments of the present invention, the second insulating film 220 may be formed of silicon dioxide ($SiO_2$), silicon oxynitride (SiON), silicon nitride (SiN), amorphous carbon, or combinations thereof. The second barrier layer 230 may be formed of amorphous carbon, silicon dioxide, silicon nitride, nitride, various metals, or combinations thereof.

Figure 5:
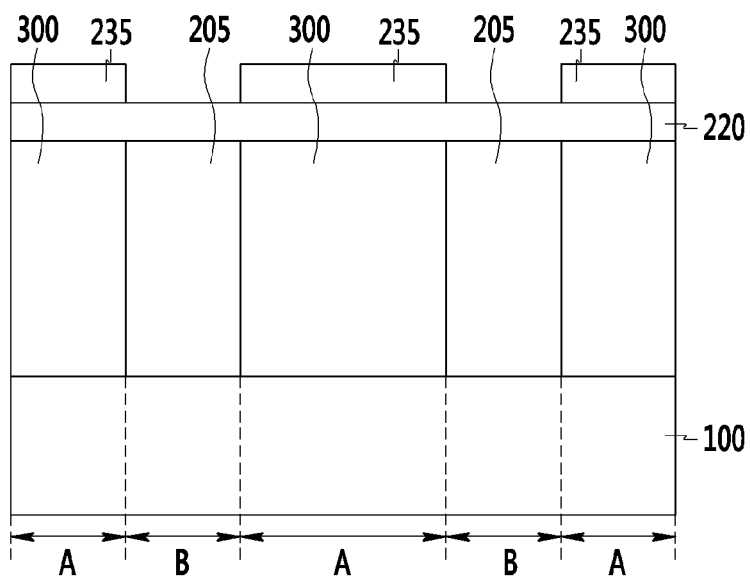
Figure 6:
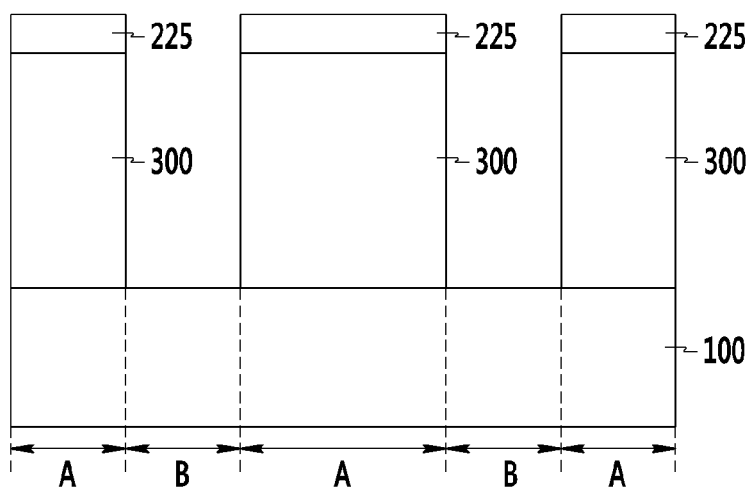

As shown in FIGS. 5 and 6, the second barrier layer 230 is etched to form a second barrier layer pattern 235 (FIG. 5), and then the second insulating film 220 is etched by using the second barrier layer 235 as a mask to form a second insulating film pattern 225 (FIG. 6). As shown, the first insulating film pattern 205 is etched by using the second barrier layer pattern 235 as a mask to thereby expose the second portion B of the first surface of the n+ type silicon carbide substrate 100. The second insulating film pattern 225 is positioned on the n type epitaxial layer 300.

Figure 7:
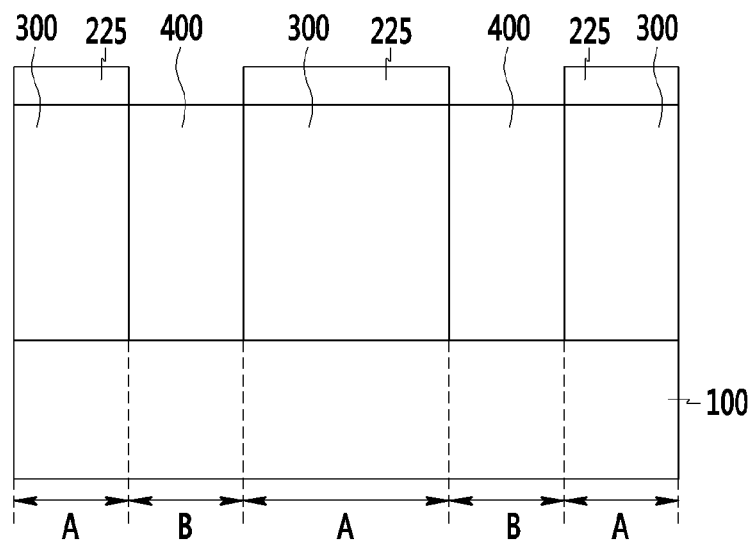

As shown in FIG. 7, a p type epitaxial layer 400 is formed by a second epitaxial growth on the exposed second portion B of the first surface of the n+ type silicon carbide substrate 100. Epitaxial growth does not occur in the portion where the second insulating film pattern 225 is provided. Further, as shown, the height of the p type epitaxial layer 400 is equal to the height of the n type epitaxial layer 300, and the p type epitaxial layer 400 is positioned in between the n type epitaxial layer 300. Thus, the p type epitaxial layer 400 and the n type epitaxial layer 300 form a PN junction. Further, the PN junction surface is not curved because the n type epitaxial layer 300 and the p type epitaxial layer 400 are formed by the first and second epitaxial growths, respectively.

Figure 8:
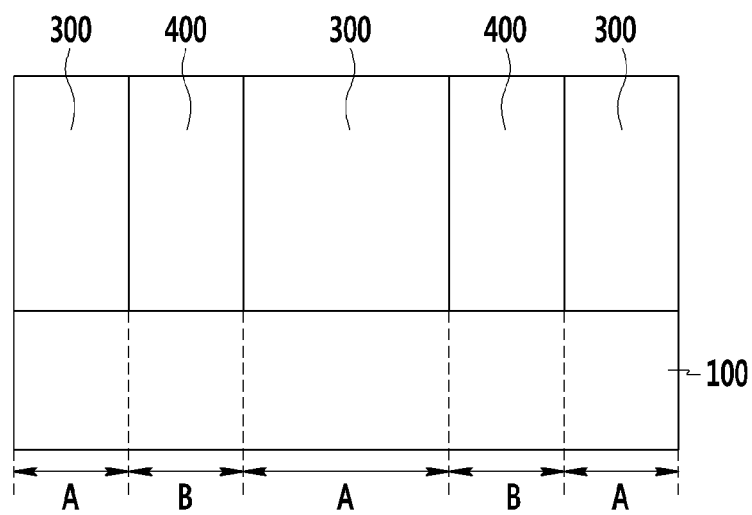
Figure 9:
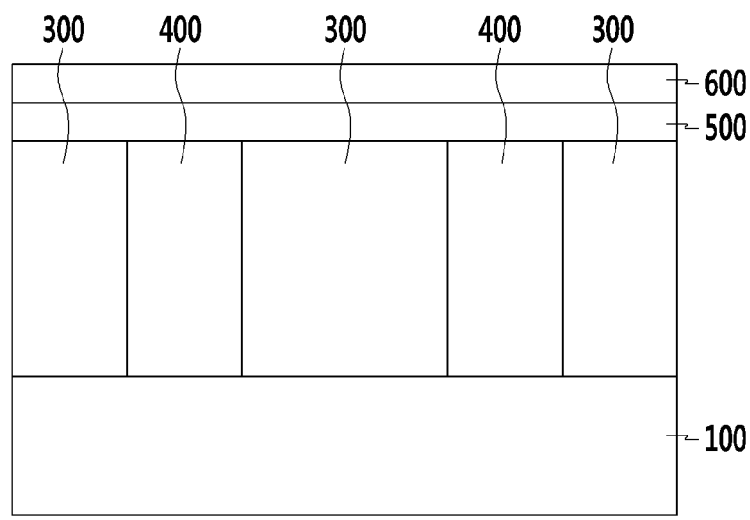

As shown in FIGS. 8 and 9, after the second insulating film pattern 225 is removed (see FIGS. 7-8), a p+ region 500 and an n+ region 600 are sequentially formed on the n type epitaxial layer 300 and the p type epitaxial layer 400 (FIG. 9).

Figure 10:
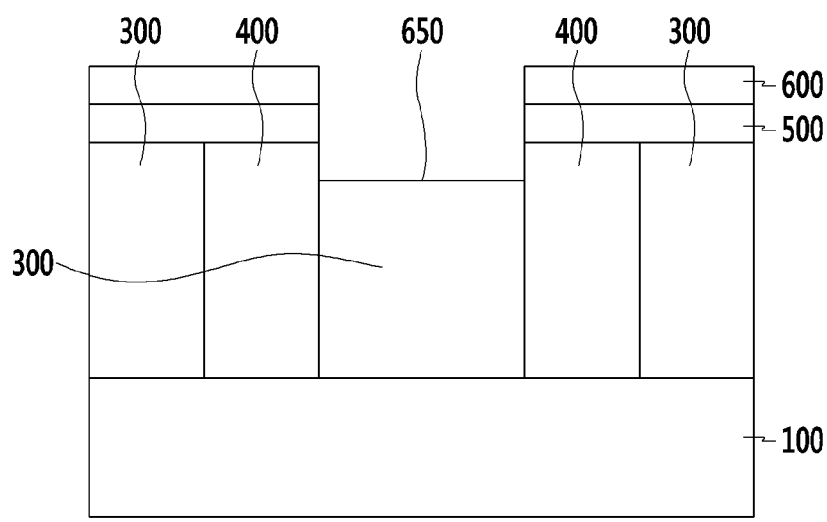
Figure 11:
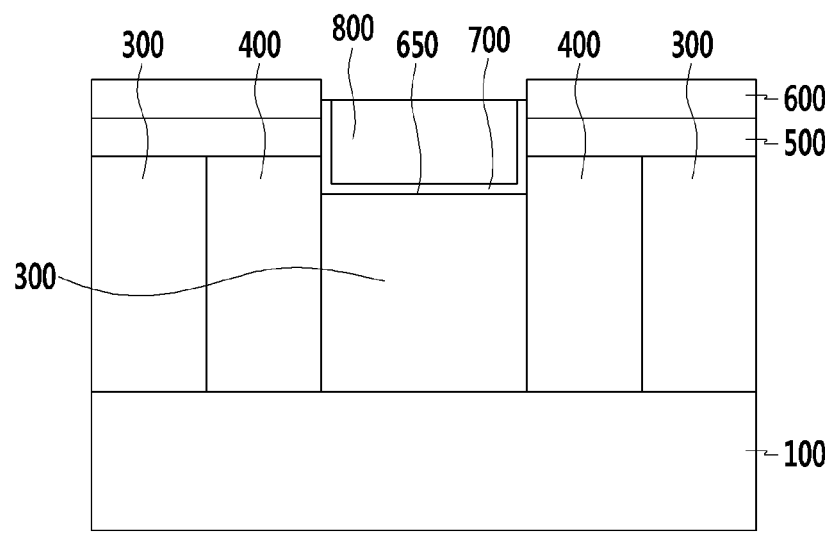

As shown in FIG. 10, a trench 650 is formed by penetrating the p+ region 500 and the n+ region 600 and etching part of the n type epitaxial layer 300. A gate insulating film 700 is then formed within the trench 650, and then a gate electrode 800 is formed on the gate insulating film 700 (FIG. 11). As shown, the gate electrode 800 is preferably configured and arranged so as to substantially fill the trench 650. As shown in FIG. 11, the gate electrode 800 is disposed so as to be positioned above the n type epitaxial layer 300. Further, a portion of the n+ region 600 is removed at opposing sides opposite the trench 650 to expose part of the p+ region 500 (see FIGS. 11-12).

Figure 12:
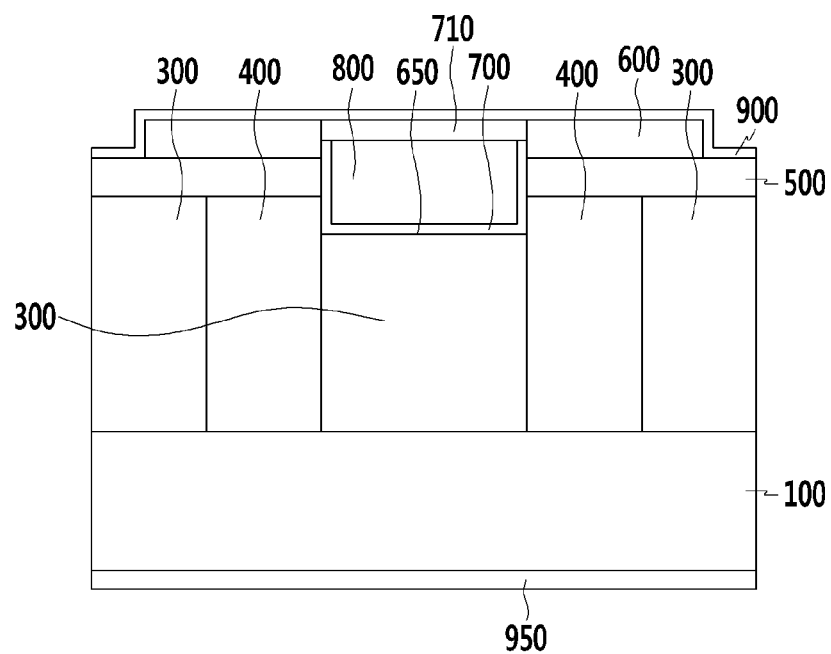

As shown in FIG. 12, an oxide film 710 is formed on the gate electrode 800 and the gate insulating film 700. Thereafter, a source electrode 900 is formed on the exposed part of the p+ region 500, the n+ region 600, and the oxide film 710. Further, a drain electrode 950 is formed on a second surface of the n+ type silicon carbide substrate 100 (i.e. a surface opposite the first surface, "bottom surface").

According to the present methods, high aspect-ratio anisotropic etching can be performed because the first insulating film 200 is etched by using the first barrier layer 210. Therefore, there is no limitation to the thickness of the first insulating film 200. As such, the n type epitaxial layer 300 and the p type epitaxial layer 400, which can be formed having the same thickness as the first insulating film 200, may be made thicker than in the conventional art. This offers an advantage in the fabrication of a high-voltage power semiconductor.

A semiconductor device according to another exemplary embodiment of the present invention will now be described with reference to FIG. 13.

Figure 13:
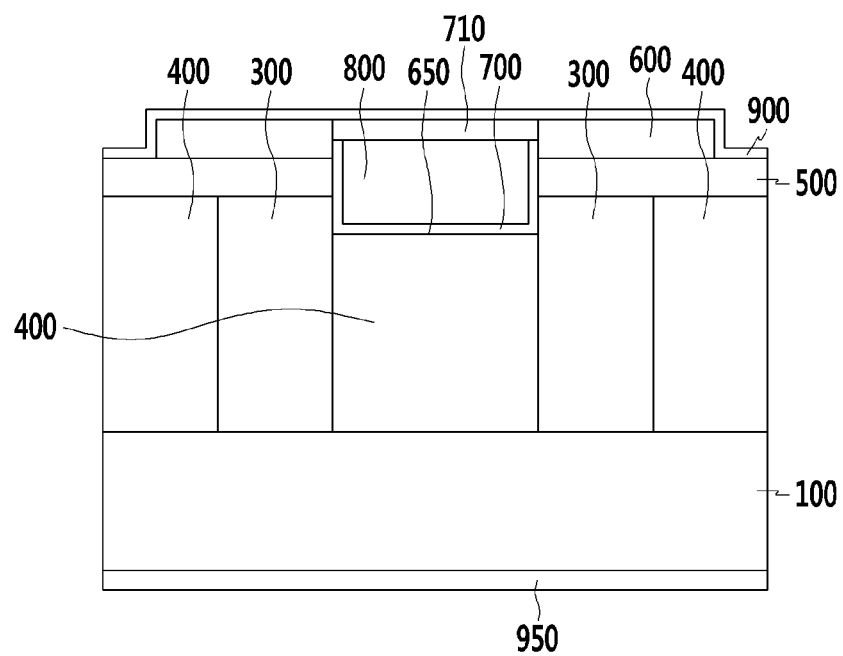
FIG. 13 is a view showing a cross-section of a semiconductor device according to another exemplary embodiment of the present invention.

FIG. 13 is a view showing a cross-section of a semiconductor device according to another exemplary embodiment of the present invention.

As shown in FIG. 13, the semiconductor device is identical to the above semiconductor device of FIG. 12 except that the p type epitaxial layer 400 is positioned under the gate electrode 800.

In particular, a p type epitaxial layer 400 and an n type epitaxial layer 300 are formed on a first surface of an n+ type silicon carbide substrate 100 by second and first epitaxial growths, and then a p+ region 500 and an n+ region 600 are sequentially formed on the n type epitaxial layer 300 and the p type epitaxial layer 400, respectively.

Next, a trench 650 is formed by penetrating the p+ region 500 and the n+ region 600 and etching part of the p type epitaxial layer 400. Thereafter, a gate insulating film 700 is formed within the trench 650, and a gate electrode 800 is formed on the gate insulating film 700. Further, a portion of the p+ region 500 is removed at opposing sides opposite the trench 650 to expose part of the n+ region 600.

Next, an oxide film 710 is then formed on the gate electrode 800 and the gate insulating film 700. Then a source electrode 900 is formed on the exposed part of the p+ region 500, the n+ region 600, and the oxide film 710. A drain electrode 950 is then formed on a second surface of the n+ type silicon carbide substrate 100 (i.e. a surface opposite the first surface, "bottom surface").

A semiconductor device according to still another exemplary embodiment of the present invention will now be described with reference to FIG. 14.

Figure 14:
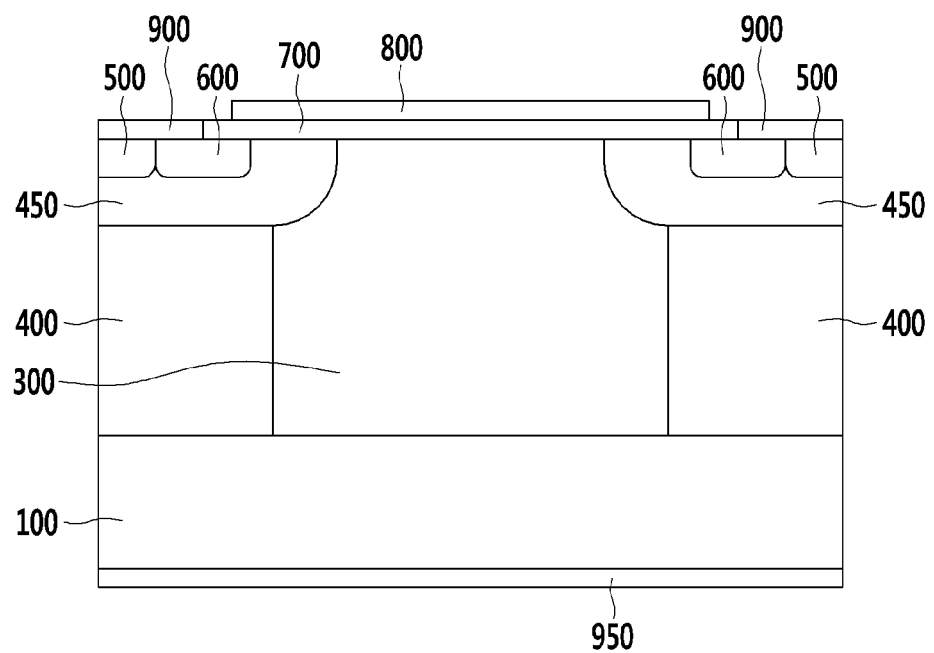
FIG. 14 is a view showing a cross-section of a semiconductor device according to still another exemplary embodiment of the present invention.

FIG. 14 is a view showing a cross-section of a semiconductor device according to still another exemplary embodiment of the present invention.

As shown in FIG. 14, the semiconductor device has no trench formed therein, unlike the semiconductor devices of FIGS. 12 and 13.

The semiconductor device of FIG. 14 can, for example, be formed by disposing an n type epitaxial layer 300 and a p type epitaxial layer 400 on a first surface of an n+ type silicon carbide substrate 100. The n type epitaxial layer 300 and the p type epitaxial layer 400 are formed by epitaxial growth. The n type epitaxial layer 300 and the p type epitaxial layer 400 can be formed by using an insulating film and a barrier layer in the same way as in the foregoing embodiments.

A p-well region 450 can then be disposed in the n type epitaxial layer 300 and the p type epitaxial layer 400. It is noted that while the p-well region 450 is depicted in a curved shape in FIG. 14, the specific curved configuration could also be provided in various other suitable geometries. Thereafter, an n+ region 600 and a p+ region 500 are disposed side-by-side on the p-well region 450. Of course, the n+ region 600 and a p+ region 500 are not limited to the specific positioning as depicted and could, for example, be provided side-by-side with their positions swapped, and could even suitably be provided layered on top of each other, if desired.

A gate insulating film 700 is then disposed on the n type epitaxial layer 300, the p-well region 450, and part of the n+ region 600, and a gate electrode 800 is disposed on at least a portion of the gate insulating film 700.

A source electrode 900 is disposed on part of the n+ region 600 and the p+ region 500 not covered by the gate insulating film 700, and a drain electrode 950 is disposed on a second surface of the n+ type silicon carbide substrate 100 (i.e. a surface opposite the first surface, "bottom surface").

Although the foregoing exemplary embodiments have been described with respect to a MOSFET (metal oxide semiconductor field effect transistor), which is a type of power semiconductor, the present invention is not limited to these exemplary embodiments. Rather, the fabrication method of a super junction structure of the present invention may be applied to other types of power semiconductors.

For example, the fabrication method of a super junction structure according to the present exemplary embodiment may be applied to a diode, a bipolar junction transistor (BJT), an insulated gate bipolar transistor (GBT), a thyristor, etc.

Therefore, the fabrication method of a super junction structure according to the present exemplary embodiment may be applied to a p+ type silicon carbide substrate, as well as an n+ type silicon carbide substrate.

Moreover, the fabrication method of a super junction structure according to the present exemplary embodiment may also be applied to, for example, a silicon substrate and a gallium nitride (GaN) substrate, as well as a silicon carbide substrate.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

| | |
|---|---|
| 100: n+ type silicon carbide substrate | 200: first insulating film |
| 210: first barrier layer | 220: second insulating film |
| 230: second barrier layer | 300: n type epitaxial layer |
| 400: p type epitaxial layer | 450: p-well region |
| 500: p+ region | 600: n+ region |
| 650: trench | 700: gate insulating film |
| 710: oxide film | 800: gate electrode |
| 900: source electrode | 950: drain electrode |

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for fabricating a semiconductor device, the method comprising:
   sequentially forming a first insulating film and a first barrier layer on a first surface of an n+ type substrate;
   etching the first barrier layer to form a first barrier layer pattern;
   etching the first insulating film by using the first barrier layer pattern as a mask to form a first insulating film pattern to thereby expose a first portion of a first surface of the n+ type silicon carbide substrate;
   removing the first barrier layer pattern and then forming a first type of epitaxial layer by a first epitaxial growth on the exposed first portion of the first surface of the n+ type silicon carbide substrate;
   sequentially forming a second insulating film and a second barrier layer on the first type of epitaxial layer and the first insulating film pattern;
   etching the second barrier layer to form a second barrier layer pattern;
   etching the second insulating film by using the second barrier layer pattern as a mask to form a second insulating film pattern, and etching the first insulating film pattern by using the second barrier layer pattern as a mask to expose a second portion of the first surface of the n+ type silicon carbide substrate; and
   forming a second type of epitaxial layer by a second epitaxial growth on the exposed second portion of the first surface of the n+ type silicon carbide substrate,
   wherein the first portion of the first surface of the n+ type silicon carbide substrate and the second portion of the first surface of the n+ type silicon carbide substrate are adjacent to each other.

2. The method of claim 1 wherein the an n+ type substrate is an n+ type silicon carbide substrate.

3. The method of claim 1, wherein the first insulating film pattern, the first type epitaxial layer, and the second type epitaxial layer have the same thickness.

4. The method of claim 1, wherein the second insulating film pattern is positioned on the first type of epitaxial layer.

5. The method of claim 4, wherein the first insulating film and the second insulating film are formed of silicon dioxide, silicon oxynitride, silicon nitride, amorphous carbon, or combinations thereof.

6. The method of claim 5, wherein the first barrier layer and the second barrier layer are formed of amorphous carbon, silicon dioxide, silicon nitride, nitride, metal, or combinations thereof.

7. The method of claim 1, further comprising:
   after the forming of a second type of epitaxial layer,
   removing the second insulating film pattern and then sequentially forming a p+ region and an n+ region on the first type of epitaxial layer and the second-type of epitaxial layer;
   forming a trench by penetrating the p+ region and the n+ region and etching part of the first type epitaxial layer;
   forming a gate insulating film within the trench;
   forming a gate electrode on the gate insulating film;
   forming an oxide film on the gate insulating film and the gate electrode; and
   forming a source electrode on the n+ region and the oxide film and forming a drain electrode on a second surface of the n+ type silicon carbide substrate.

8. The method of claim 6, wherein the first type of epitaxial layer is positioned under the gate electrode.

9. The method of claim 7, wherein the first type of epitaxial layer is an n type epitaxial layer, and the second type of epitaxial layer is a p type epitaxial layer.

10. The method of claim 7, wherein the first type of epitaxial layer is a p type epitaxial layer, and the second type of epitaxial layer is an n type epitaxial layer.

* * * * *